United States Patent
Chang et al.

[11] Patent Number: 5,841,165
[45] Date of Patent: Nov. 24, 1998

[54] PMOS FLASH EEPROM CELL WITH SINGLE POLY

[75] Inventors: Shang-De Ted Chang, Fremont; Jayson Giai Trinh, Milpitas, both of Calif.

[73] Assignee: Programmable Microelectronics Corporation, San Jose, Calif.

[21] Appl. No.: 577,405

[22] Filed: Dec. 22, 1995

Related U.S. Application Data

[63] Continuation-in-part of Ser. No. 560,249, Nov. 21, 1995.

[51] Int. Cl.$^6$ .................................................. H01L 29/788
[52] U.S. Cl. .......................................... 257/318; 257/320
[58] Field of Search ................................... 257/318, 319, 257/320

[56] References Cited

U.S. PATENT DOCUMENTS

| | | | |
|---|---|---|---|
| 3,919,711 | 11/1975 | Chou | 357/23 |
| 4,019,197 | 4/1977 | Lohstroh et al. | 357/23 |
| 4,035,820 | 7/1977 | Matzen . | |
| 4,288,803 | 9/1981 | Adam | 365/182 |
| 4,404,577 | 9/1983 | Cranford, Jr. et al. | 357/23 |
| 4,425,631 | 1/1984 | Adam | 365/185 |
| 4,532,535 | 7/1985 | Gerber et al. | 357/23.5 |
| 4,924,278 | 5/1990 | Logie . | |
| 4,970,565 | 11/1990 | Wu et al. | 357/23.5 |
| 5,081,371 | 1/1992 | Wong | 6307/296.2 |
| 5,216,588 | 6/1993 | Bajwa et al. | 363/60 |
| 5,282,161 | 1/1994 | Villa | 365/185 |
| 5,291,047 | 3/1994 | Iwasa | 257/318 |
| 5,398,001 | 3/1995 | Karl | 327/258 |
| 5,404,037 | 4/1995 | Manley | 257/321 |
| 5,504,706 | 4/1996 | D'Arrigo et al. | 365/185.18 |
| 5,576,568 | 11/1996 | Kowshik | 257/318 |

*Primary Examiner*—Ngân V. Ngô
*Attorney, Agent, or Firm*—Skjerven, Morrill, MacPherson, Franklin & Friel

[57] ABSTRACT

A P-channel single-poly EPROM cell has P+ source and P+ drain regions, and a channel extending therebetween, formed in an N-type well. A thin layer of tunnel oxide is provided over the channel and, in some embodiments, over significant portions of P+ source and P+ drain regions. A poly-silicon floating gate overlies the tunnel oxide. A P diffusion region is formed in a portion of the N-well underlying the floating gate and is thereby capacitively coupled to the floating gate. In this manner, the P diffusion region serves as a control gate for the memory cell. Programming is accomplished by coupling a sufficient voltage to the floating gate via the control gate while biasing the source and drain regions to cause the hot injection of electrons from the N-well/drain junction to the floating gate, while erasing is realized by biasing the floating gate, N-well, source and drain regions appropriately so as cause the tunneling of electrons from the floating gate to the N-well, the source, and the drain. In another embodiment, an N-type diffusion region is formed within the P diffusion region and serves as the control gate.

11 Claims, 14 Drawing Sheets

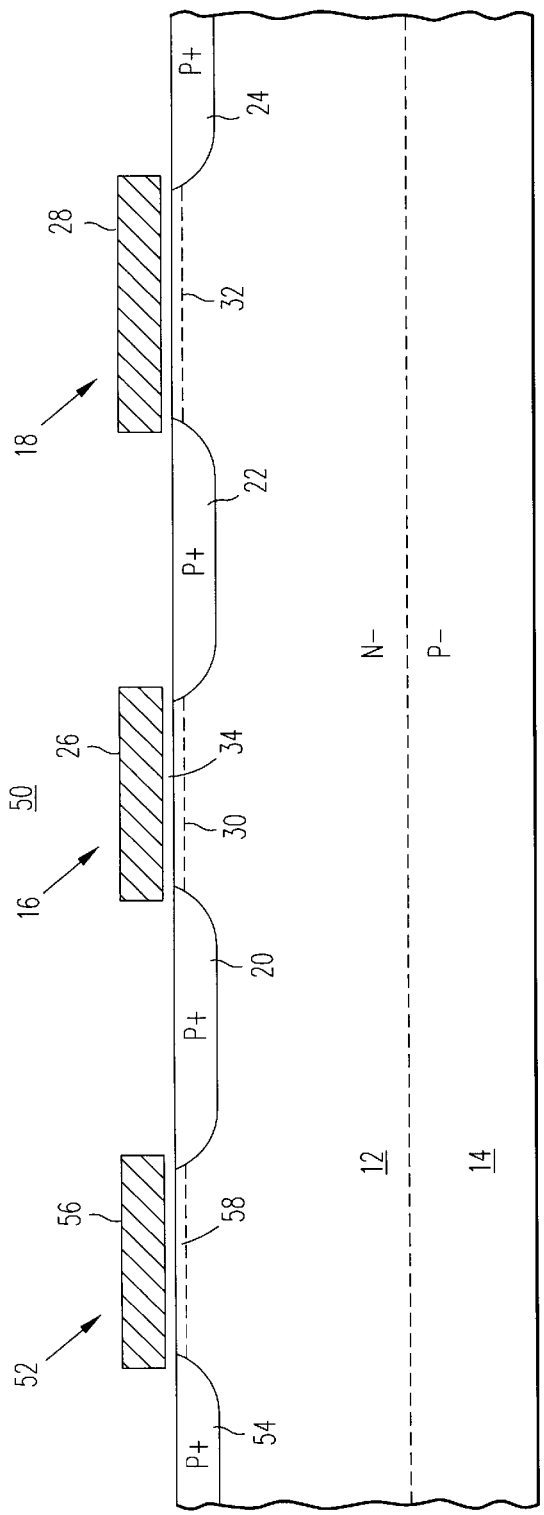
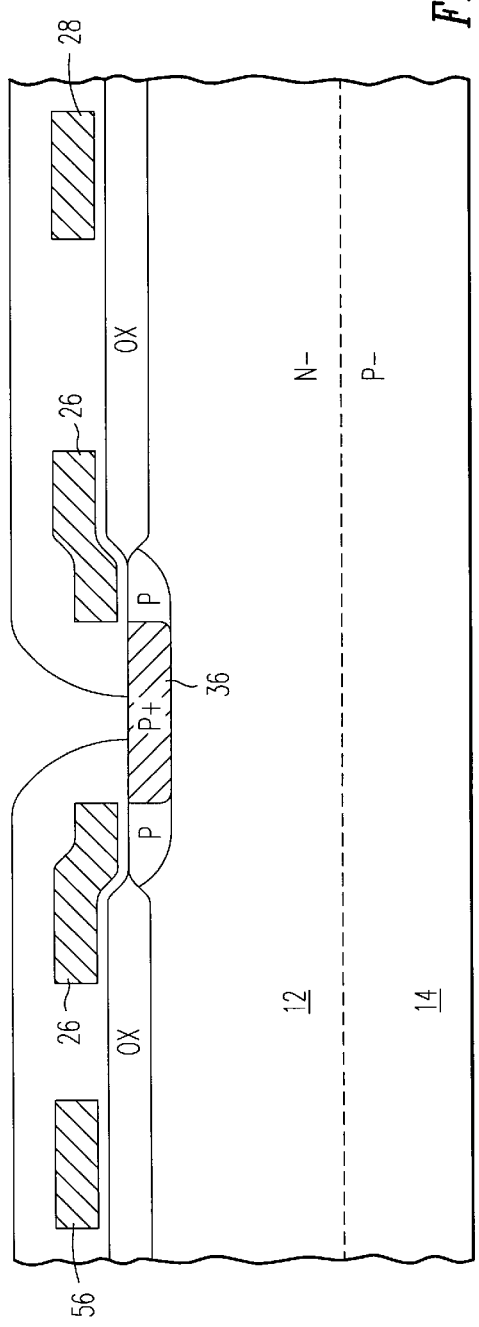

PMOS FLASH EEPROM CELL WITH SINGLE POLY

CROSS REFERENCE TO RELATED APPLICATIONS

This is a continuation-in-part application of commonly owned parent application Ser. No. 08/560,249, filed Nov. 21, 1995.

BACKGROUND

1. Field of the Invention

The present invention relates generally to memory cells and specifically to a P-channel single poly memory cell.

2. Description of Related Art

It is desirable, when embedding memory cells into a standard logic process, to do so without changing the single-poly process typically used in the fabrication of the logic circuitry. This desire has led to the development of a single-poly EEPROM cell having N+ source and N+ drain regions formed in a P- substrate and a polysilicon gate overlying a channel region extending between the source and the drain. An N diffusion region formed in the P- substrate serves as the control gate and is capacitively coupled to the floating gate via a thin oxide layer. The oxide layer has a tunnel window opened in a portion thereof near the N+ drain to facilitate electron tunneling. Since the control gate and floating gate of this single-poly EEPROM cell form a capacitor in a manner similar to that of the more traditional stacked-gate, or double-poly, EEPROM cells, the single-poly EEPROM cell is programmed, erased, and read in a manner similar to that of the double-poly EEPROM cell. That is, programming is accomplished by electron tunneling from the floating gate to the substrate, while erasing is realized by electron tunneling from the substrate/drain region to the floating gate.

The above-described N-channel single-poly EEPROM cell is disadvantageous since it requires programming and erasing voltages of 20 V. These high programming and erase voltages limit the extent to which the size of such cells may be reduced. Accordingly, it would be desirable to form a single poly EEPROM cell which requires lower programming voltages.

SUMMARY

A single-poly memory cell is disclosed herein which overcomes problems in the art described above. In accordance with the present invention, a P-channel single-poly flash EEPROM cell has P+ source and P+ drain regions, and a channel extending therebetween, formed in an N-type well. A thin layer of tunnel oxide is provided over the channel and, in some embodiments, over significant portions of the P+ source and P+ drain regions. A poly-silicon floating gate overlies the tunnel oxide. A P diffusion region is formed in a portion of the N-well underlying the floating gate and is thereby capacitively coupled to the floating gate. In this manner, the P diffusion region serves as a control gate for the memory cell. Programming is accomplished by coupling a sufficient voltage to the floating gate via the control gate while biasing the source and drain regions so as to cause the injection of hot electrons from the N-well/drain junction to the floating gate, while erasing is realized by biasing the floating gate, N-well, source and drain regions appropriately so as cause the tunneling of electrons from the floating gate to the N-well, source, and drain.

In another embodiment, an N-type diffusion region is formed within the above-described P-type diffusion region, where the N-type diffusion region serves as the control gate. In this manner, voltages may be applied to the control gate in excess of those applied to the N-well without creating a current path from the control gate to the N-well. In yet another embodiment, additional P diffusion regions underlying portions of the floating gate and separated therefrom by a layer of tunnel oxide serve as erase gates for the memory cell. In this embodiment, the memory cell may be erased by causing electrons to tunnel from the floating gate to the erase gates. Lower erase voltages are possible with more than one erase gate.

BRIEF DESCRIPTION OF THE DRAWINGS

FIG. 6 is a cross-sectional view of the cell of FIG. 5 taken along line E—E;

FIG. 7 is a cross-sectional view of the cell of FIG. 5 taken along line F—F;

DETAILED DESCRIPTION

Figure 1:
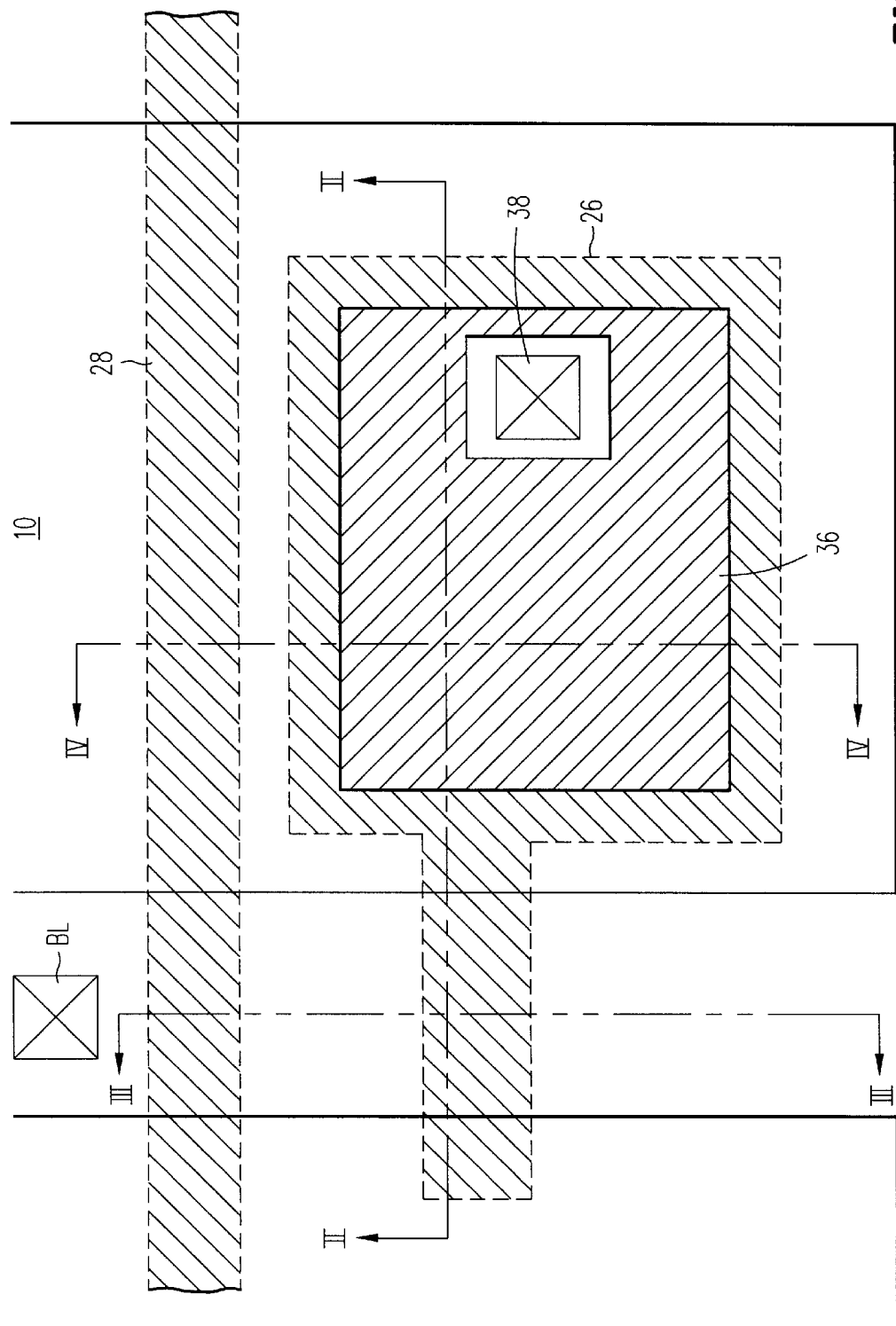
FIG. 1 is a top view of a PMOS single-poly flash cell in accordance with the present invention.

Referring now to FIGS. 1–4, a P-channel single poly flash cell 10 (FIG. 3A) is formed in an N-well 12 provided within a P-substrate 14 and includes a P-channel storage transistor 16 and a P-channel select transistor 18. P+ diffusion region 20 serves as the source for storage transistor 16, P+ diffusion region 22 serves as both the drain for storage transistor 16 and the source for select transistor 18, and P+ diffusion region 24, which is coupled to a bit line BL, serves as the drain for select transistor 18. Poly-silicon gates 26 and 28 serve as the floating gate and select gate, respectively, of flash cell 10. Application of a bias voltage to a control gate 36 (FIGS. 1 and 2) enhances a channel 30 (FIG. 3A) extending between source 20 and drain 22 of storage transistor 16, and the application of a bias voltage to select gate 28 enhances a channel 32 extending between source 22 and drain 24 of select transistor 18.

A P-type buried diffusion layer 36 (FIG. 2) serves as the control gate of flash cell 10. A contact 38 (FIG. 1) is opened in floating gate 26 and in a layer of oxide 40 interposed between floating gate 26 and control gate 36 to enable electrical contact with buried control gate 36. Tunnel oxide layer 34 (FIG. 3A), which is preferably 80–130 Å thick, may extend over channel 30 and substantial portions of source 20 and drain 22. A layer of oxide 40 (FIG. 2) approximately 80–350 Å thick is provided between floating gate 26 and P diffusion region 36. It is to be noted that unlike conventional N-channel single-poly EEPROM cells, it is not necessary to open a tunnel window in tunnel oxide layer 34.

Together, floating gate 26 and control gate 36 form an MOS capacitor in the same manner as that of conventional N-channel EEPROM cells. When floating gate 26 is uncharged, cell 10 has a threshold voltage $V_t$ of approximately −4.5 V.

Figure 2:
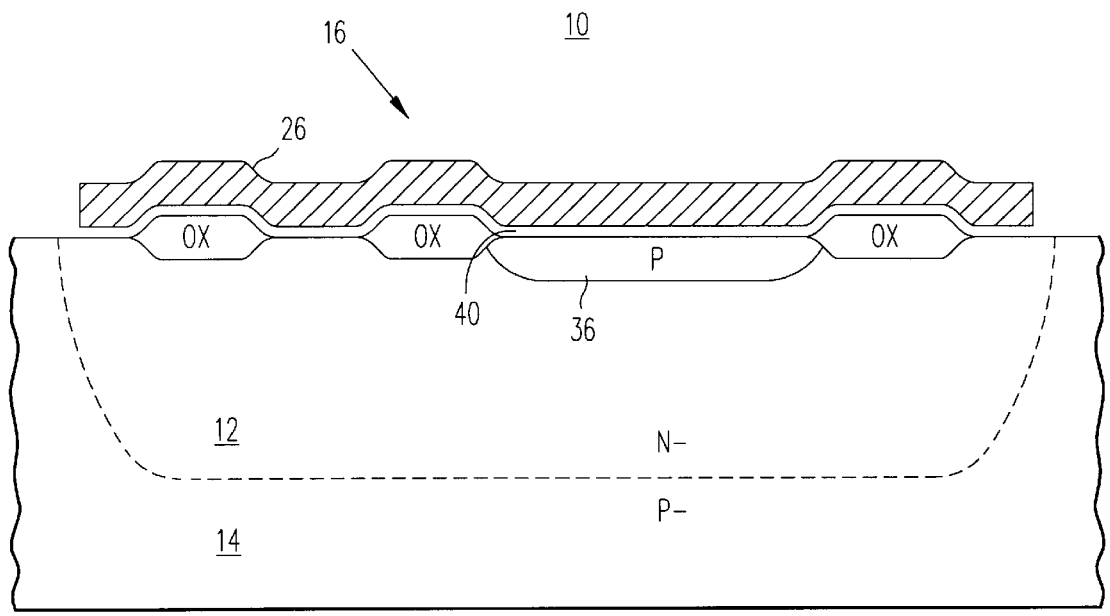
FIG. 2 is a cross-sectional view of the cell of FIG. 1 taken along line A—A.

The operation of cell 10 is as follows. To program cell 10, bit line BL and select gate 28 are grounded (FIG. 3A) while source 20 and N-well 12 are held at approximately 8 V. Approximately 8.5 V is applied to control gate 36 (FIG. 2). Positively charged holes from P+ source 20 are attracted to the less positive voltage on P+ drain 22 and accelerate through channel region 30 towards P+ drain 22. These holes collide with electrons in the depletion layer proximate drain 22. High energy electrons generated from the resultant impact ionization are attracted by the positive voltage of floating gate 26 (approximately 7.5 V is capacitively coupled thereto via control gate 36, source 20, channel region 30, and drain 22) and are thus injected from the drain depletion layer into floating gate 26. The resultant negative charge on floating gate 26 depletes channel region 30 and forces cell 10 into deep depletion. In the preferred embodiment, storage transistor 16 has, in its programmed state, a $V_t$ equal to approximately 1 V. In the preferred embodiment, a current limiting device (not shown) is coupled to bit line BL to prevent programming currents from exceeding approximately 100 μA, thereby limiting power consumption during programming.

Figure 3A:
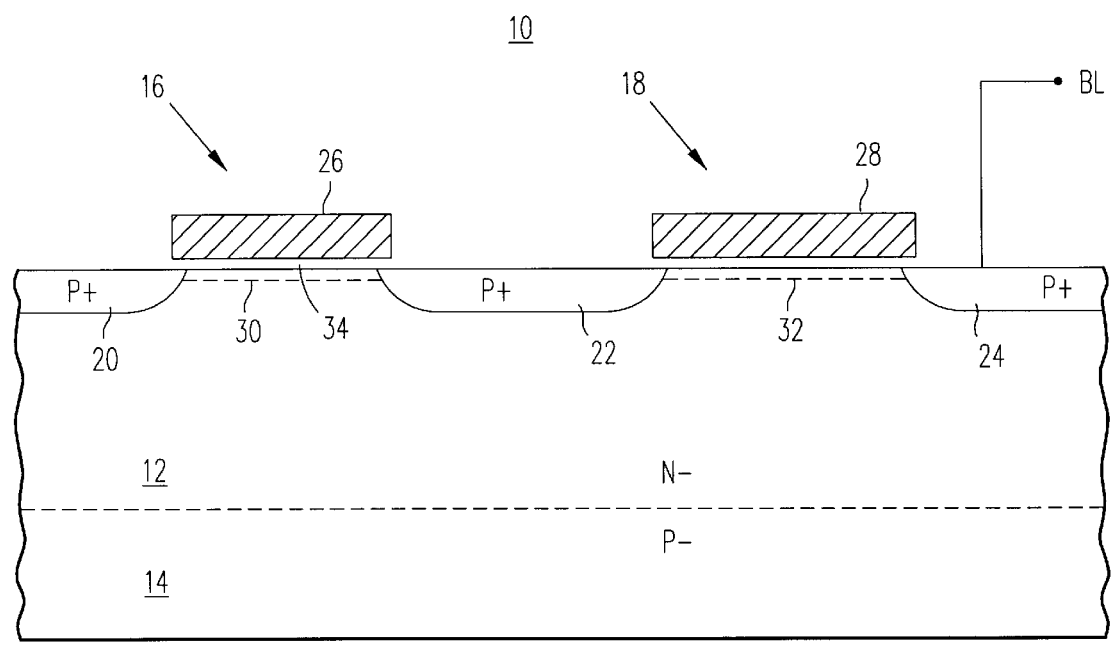
FIGS. 3A and 3B are cross-sectional views of the cell of FIG. 1 taken along line B—B.

Cell 10 is erased in FIG. 3A by applying approximately 18 V to bit line BL, P+ source 20, and N-well 12 while grounding select gate 28 and control gate 36 (FIG. 2). Electrons tunnel from floating gate 26 through the entire length of tunneling oxide layer 34 into channel 30, source 20, and drain 22, thereby returning the threshold voltage of storage transistor 16 to its normal erased state value of approximately −4 V. Note that electrons will tunnel from floating gate 26 and thereby erase cell 10 only if the voltage on drain 24 voltage is approximately 18 volts.

In another embodiment, cell 10 in FIG. 3A may be erased by applying approximately 8V to bit line BL, P+ source 20, and N-well 12 while grounding select gate 28 and applying approximately −10V to control gate 36. The application of these erase voltages, which results in an erasing of cell 10 in a manner identical to that described earlier, advantageously requires lower erasing voltages.

Where it is desired to read cell 10, in FIG. 3A, a read voltage of approximately ($V_{cc}$−2V) is applied to control gate 36 (FIG. 2) and $V_{cc}$ is applied to P+ source 20 and to N-well 12. Select gate 28 is grounded. A voltage less than $V_{cc}$ is applied to P+ drain 24 via bit line BL. Cell 10 will conduct channel current only if cell 10 is programmed, i.e., only if there is negative charge stored in floating gate 26. Thus, since a read current flows through cell 10 when floating gate 26 is negatively charged, a programmed cell 10 does not suffer from read disturb problems characteristic of conventional N-channel EEPROM cells. When cell 10 is in an erased state, the voltage on floating gate 26 is always less than the voltage on drain 22. In this manner, cell 10 does not exhibit read disturb problems when in an erased state.

Acceptable ranges for the above-described reading, erasing, and programming bias conditions for cell 10 are provided below in Table 1.

TABLE 1

| | Electrical bias conditions | | | | |
|---|---|---|---|---|---|
| Mode | Bit Line | Select Gate | Source | N-well | Control Gate |
| Program | 0 V | 0 V | 5–15 V | 5–15 V | 5–15 V |
| Erase (option 1) | 3–15 V | 0 V | 3–15 V | 3–15 V | −3 to −15 V |
| Erase (option 2) | 15–22 V | 0 V | 15–22V | 15–22 V | 0 V |
| Read | less than Vcc | 0 V | Vcc | Vcc | 0 to Vcc |

The above-described operation of cell 10 utilizes PMOS characteristics to achieve advantages over conventional N-channel single poly semiconductor memory cells. The characteristic gate current for P-channel devices is approximately 50 times that of N-channel devices. Thus, unlike conventional NMOS EPROM cells which typically require approximately a 0.5 milli-amp programming current to charge the floating gate, cell 10 requires a programming current of only a few micro-Amps. Requiring a programming current greater than one order of magnitude smaller than that of conventional NMOS memory cells such as EPROMs not only allows cell 10 to reduce power consumption during programming but also allows for page writing, i.e., to simultaneously write to numerous ones of cells 10 in a row of an associated memory array (not shown).

It is known that the channel of conventional NMOS EEPROM memory cells must be of a sufficient length to tolerate the typically high reverse bias voltage across the P-well/N+ drain junction (as well as the resultant high electric field) required during programming and erasing via electron tunneling. As a result, it is difficult to further reduce the size of such conventional EEPROM cells without incurring destructive junction stress. Since, however, the operation of cell 10 neither requires nor utilizes high voltage biases across the N-well/drain junction during programming and erasing (see Table 1), the channel length of cell 10 is not so limited. This feature allows cell 10 to be fabricated using 0.18 μm technology, thereby resulting in cell 10 being of a smaller size than conventional N-channel single-poly EEPROM cells. For instance, while cell 10 is only about 25 μm² using 0.5 μm technology, conventional N-channel single poly EEPROM cells are typically on the order of 160 μm² using 0.5 μm technology. Avoiding such high junction biases during erasing also advantageously results in a more durable and reliable memory cell.

Note that as the channel length of an NMOS transistor falls below approximately 0.7 μm, electron mobility saturates. In PMOS devices, however, hole mobility continues to increase as the channel length decreases below 0.7 μm and becomes comparable to electron mobility as the gate length is further decreased. Accordingly, minimizing the channel lengths of storage transistor 16 and select transistor 18 advantageously results in a hole mobility comparable to that of electrons, thereby increasing the accessing speed of cell 10. Further, note that programmed cell 10 in deep depletion allows for a higher read current and thus for faster read speeds.

As described above and shown in Table 1, the PMOS single poly cell 10 requires only 8.5 V for programming and erasing, as compared to the 20 V required for programming and erasing conventional NMOS single poly EEPROM cells, and is thus more readily adaptable to the low voltage operation of a standard logic process.

Figure 3B:
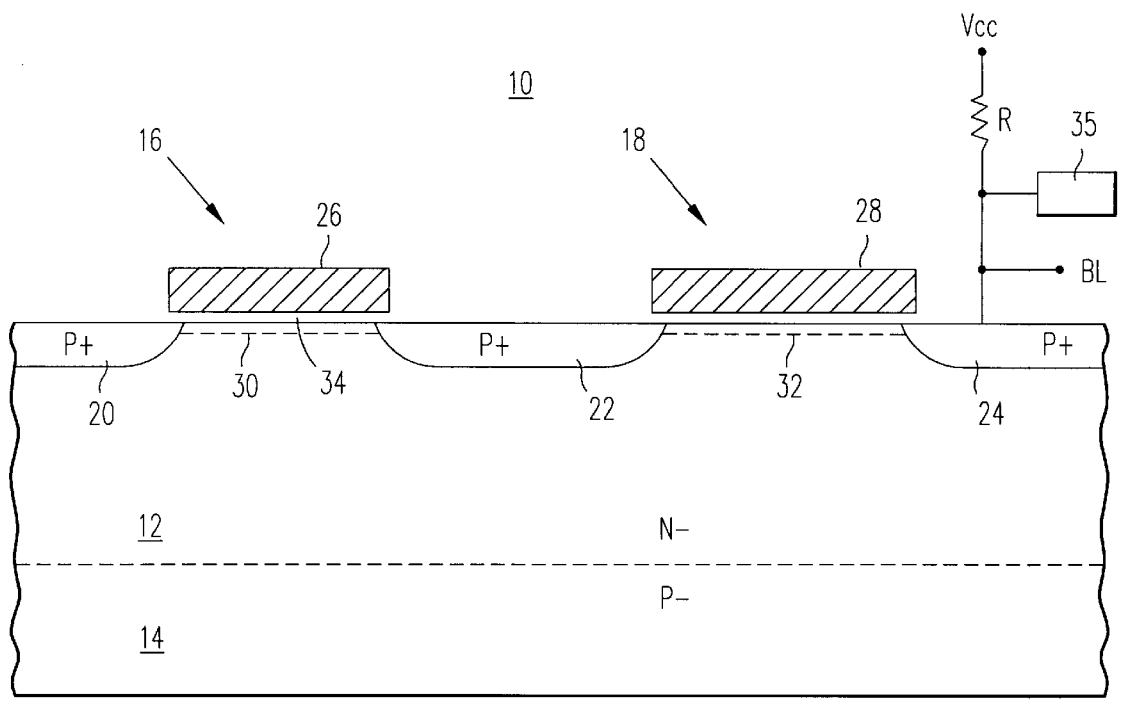
Figure 4:
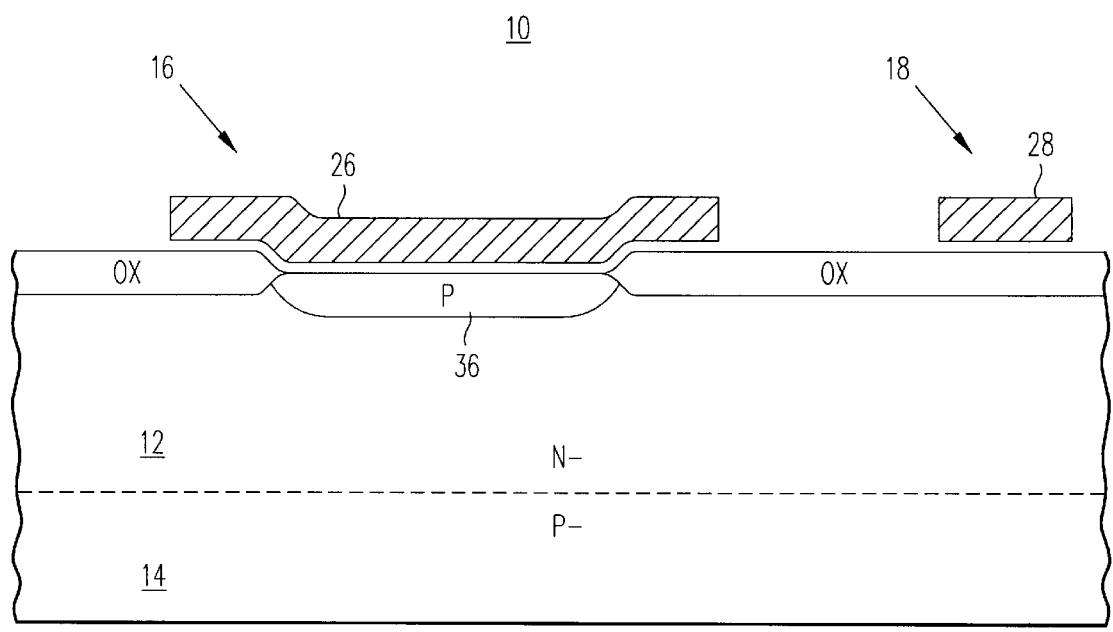
FIG. 4 is a cross-sectional view of the cell of FIG. 1 taken along line C—C.

Cell 10 is also capable of storing numerous bits of binary data by programming storage transistor 16 to one of many different threshold voltage $V_t$ levels, where the $V_t$ levels depend on, and are thus determined by, the voltage applied to control gate 36. In such multi-level threshold voltage applications, where it is necessary to accurately measure the threshold voltage $V_t$ of storage transistor 16, drain 24 of select transistor 18 is coupled to $V_{cc}$ through a high impedance resistor R and to a voltage sensing circuit 35, as shown in FIG. 3B. Sensing circuit 35 allows for accurate determination of the threshold voltage $V_t$, and thus the multiple-bit data stored in cell 10. In such multi-level applications, cell 10 has in its natural state a threshold voltage $V_t$ of approximately −6 V and has in its fully charged state a threshold voltage $V_t$ of approximately 9 V. Using a range of voltages from 5 V to 15 V as the program voltage $V_p$ applied to control gate 36 during programming, the threshold voltage $V_t$ of storage transistor 16 may be set between approximately −1 V and 9 V. Assuming $V_{cc}$ to be approximately 5 V, the range of bit line BL voltages produced in response to varying the threshold voltage $V_t$ is approximately 1 to 5 volts, thereby resulting in a 4 V range. Since the threshold voltage $V_t$ of storage transistor 16 may be programmed in 4 mV increments, 1000 levels of programming are possible with cell 10. Acceptable ranges for bias conditions during programming, reading, and erasing cell 10 for multi-level applications are listed below in Table 2.

TABLE 2

| | Electrical bias conditions | | | | |
|---|---|---|---|---|---|
| Mode | Bit Line | Select Gate | Source | N-well | Control Gate |
| Program (option 1) | 0 V | 0 V | 5–15 V | 5–15 V | desired $V_p$, i.e, (5–15 V) |

TABLE 2-continued

| | Electrical bias conditions | | | | |
|---|---|---|---|---|---|
| Mode | Bit Line | Select Gate | Source | N-well | Control Gate |
| Program (option 2) | 0 V | 0 V | 5–15 V | 5–15 V | ramp up to desired $V_p$ |
| Erase (option 1) | 3–15 V | 0 V | 3–15 V | 3–15 V | −3 to −15 V |
| Erase (option 2) | 15–22 V | 0 V | 15–22 V | 15–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

Figure 5:
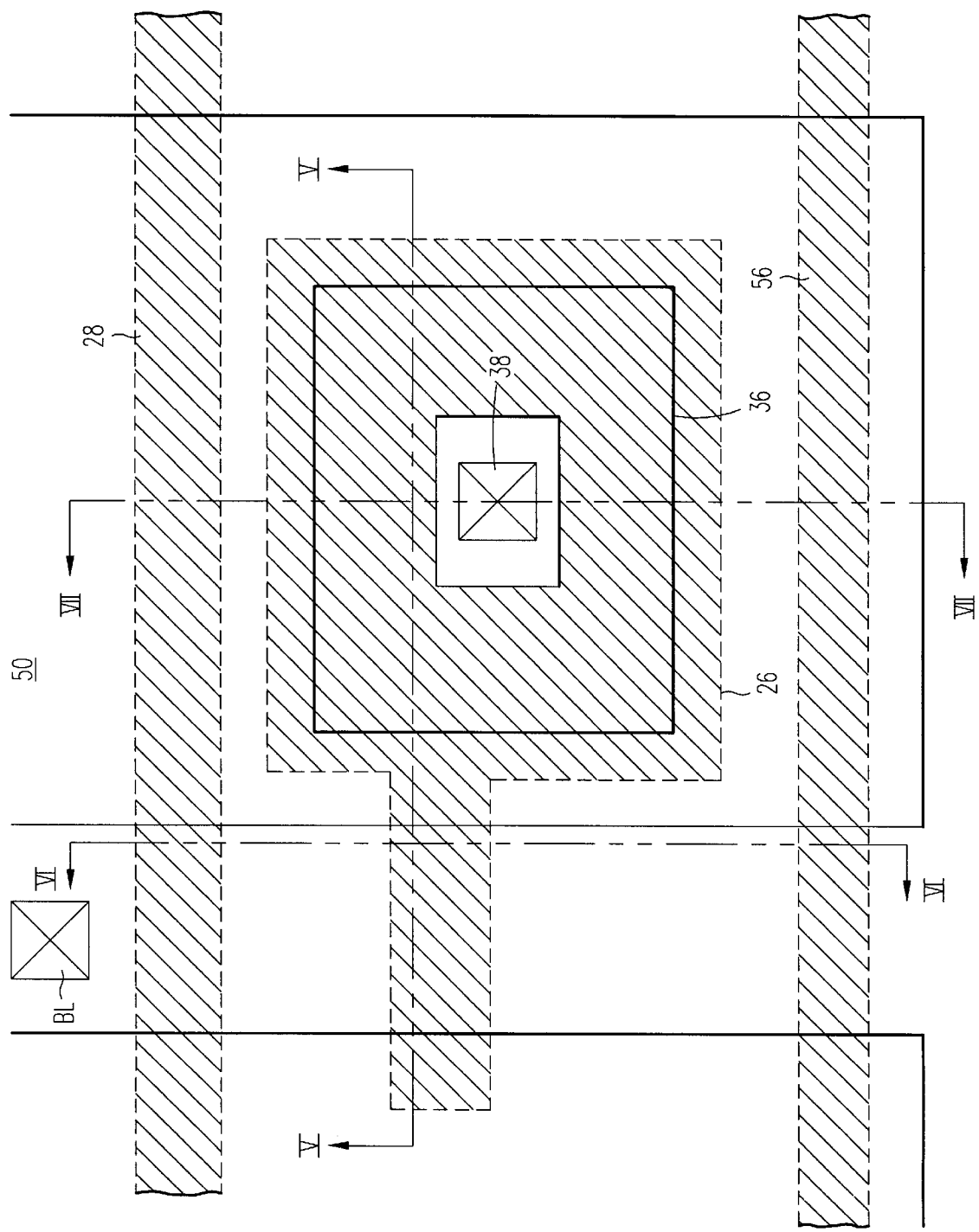
FIG. 5 is a top view of a PMOS single-poly EEPROM cell in accordance with the present invention.
Figure 8:
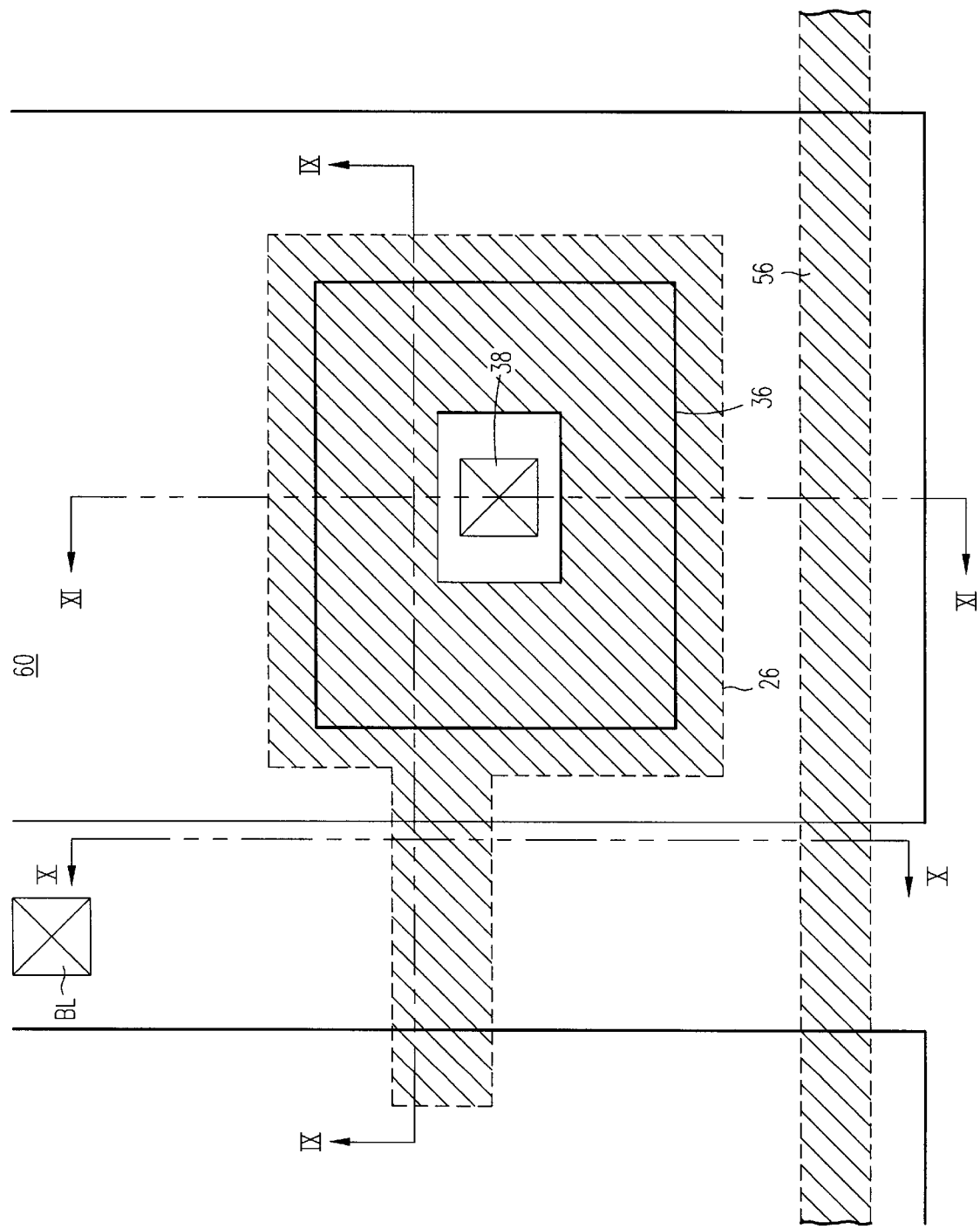
FIG. 8 is a top view of a PMOS single-poly memory cell in accordance with the another embodiment of the present invention.
Figure 9:
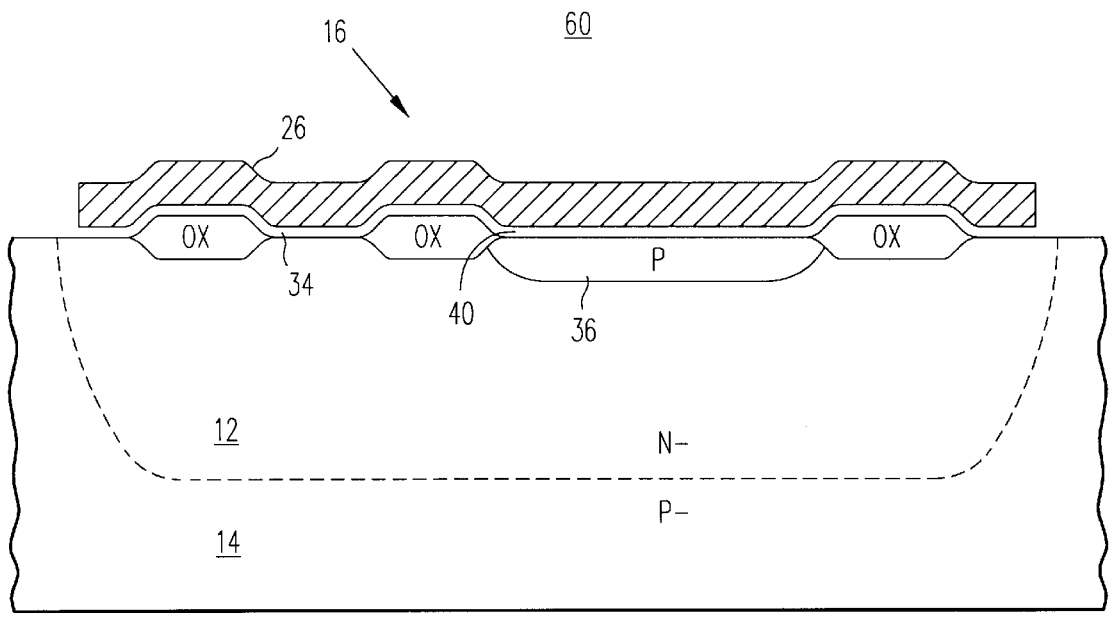
FIG. 9 is a cross-sectional view of the cell of FIG. 8 taken along line G—G.

In other embodiments, the structure of cell 10 may be incorporated into a larger PMOS single-poly EEPROM cell 50. Referring to FIGS. 5–7 (note that the cross-sectional view taken along line D—D is identical to that shown in FIG. 2 and is thus not again shown), cell 50 is shown in FIG. 6 formed in N-well 12 and includes a source select transistor 52 on the source side of cell 10. Note that those components common to cells 10 and 50 are appropriately labeled with the same numerals. P+ diffusion regions 54 and 20 serve as the source and drain, respectively, of select transistor 52. A poly-silicon gate 56 controls an underlying channel region 58. The programming, erasing, and reading operations of cell 50 are nearly identical to that described above with respect to cell 10 and will thus not be discussed in detail here. Acceptable ranges for the bias conditions for programming, erasing, and reading are listed below in Table 3. The addition of source select transistor 52 to cell 10 results in an EEPROM cell 50 that is both bit-to-bit programmable and bit-to-bit erasable. In this manner, erasing flexibility is increased.

TABLE 3

| | Bit line | Drain select gate | Source select gate | Source | N-well | Cell control gate |
|---|---|---|---|---|---|---|
| Program | 0 V | 0 V | * | 5 V–15 V | 5 V–15 V | 5–15 V |
| Erase (option 1) | 3 V–15 V | 0 V | 3 V–15 V | 3 V–15 V | 3 V–15 V | −3 V to −15 V |
| Erase (option 2) | 15 V–22 V | 0 V | 15 V–22 V | 15 V–22 V | 15 V–22 V | 0 V |
| Read | less than Vcc | 0 V | 0 V | Vcc | Vcc | 0 V to Vcc |

*0 to (source voltage - 1 V)

In a manner similar to that described above with respect to cell 10, cell 50 may be used in multi-level threshold voltage applications. In such applications, drain 24 of drain select transistor 18 is coupled to $V_{cc}$ through a high impedance resistor R (not shown) and to a voltage sensing circuit (not shown). The sensing circuit allows for accurate determination of the threshold voltage $V_t$, and thus the multiple-bit data stored in cell 50. Acceptable ranges for bias conditions during programming, reading, and erasing cell 50 for multi-level applications are listed below in Table 4.

TABLE 4

| | Bit line | Drain select gate | Source select gate | Source | N-well | Cell control gate |
|---|---|---|---|---|---|---|
| Program (option 1) | $V_p$ | 0 V | 3 V–15 V | 3 V–15 V | 3 V–15 V | −3 V to −15 V |
| Program (option 2) | $V_p$ | 0 V | 15 V–22 V | 15 V–22 V | 15 V–22 V | 0 V |
| Erase | 0 V | 0 V | * | 5 V–15 V | 5 V–15 V | 5 V–15 V |
| Read (option 1) | less than Vcc | 0 V | 0 V | Vcc | Vcc | 0 to Vcc |
| Read (option 2) | pre-charge to Vcc | 0 V | 0 V | 0 V | Vcc | 0 V |

*0 to (source voltage - 1 V)

Figure 10:
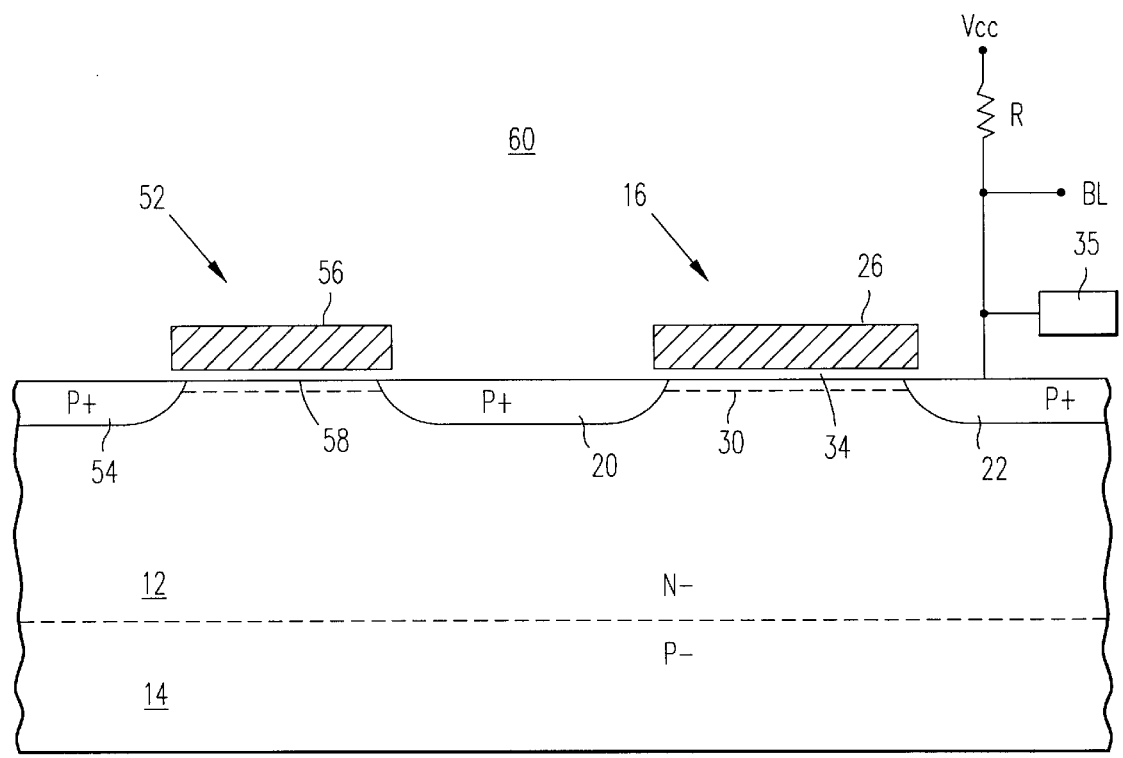
FIG. 10 is a cross-sectional view of the cell of FIG. 8 taken along line H—H.
Figure 11:
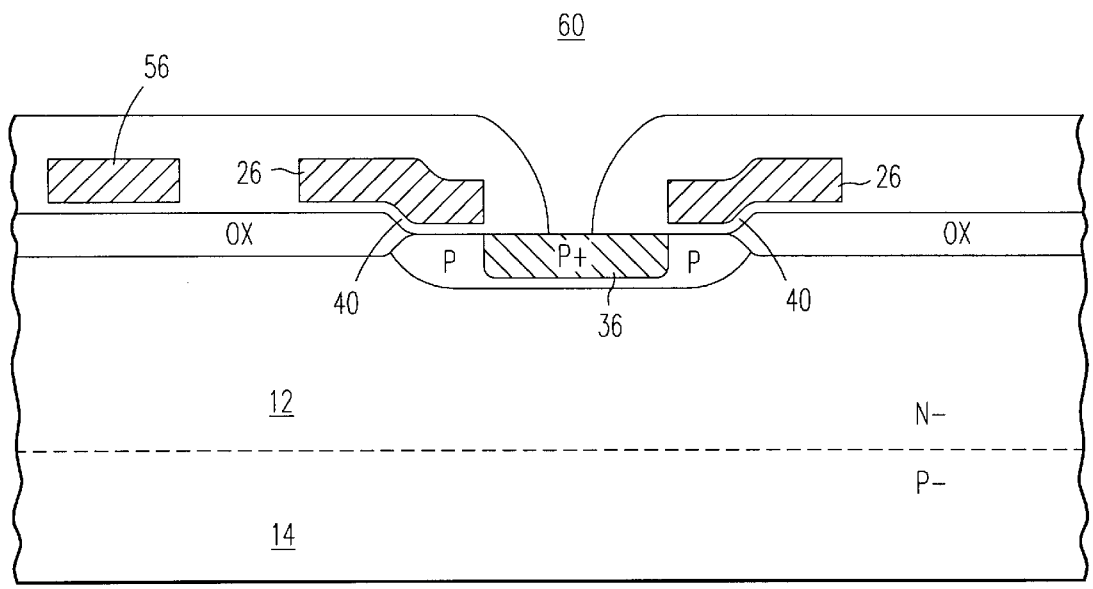
FIG. 11 is a cross-sectional view of the cell of FIG. 8 taken along line I—I.

In yet another embodiment in accordance with the present invention as shown in FIGS. 8–11, cell 60 in FIG. 10 includes storage transistor 16 which is coupled directly to bit line BL and source select transistor 52 which is coupled to source 20 of storage transistor 16, where those components common to cells 10, 50, and 60 are appropriately labeled with the same numerals. Note that drain 22 of storage transistor 16 may be coupled to $V_{cc}$ via high impedance resistor R and also to voltage sensing circuit 35 to enable accurate determination of the programmed threshold voltage $V_t$ of storage transistor 16. Cell 60 is of a smaller size than cell 50 and allows for column, or sector, erasing. The operation of cell 60 is similar to that described above with respect to cell 50. Acceptable bias condition ranges for programming, erasing, and reading cell 60 are listed below in Table 5.

TABLE 5

| | Bit line | Source select gate | Source | N-well | Cell control gate |
|---|---|---|---|---|---|
| Program (option 1) | 0 V | 0 V | 5 V–15 V | 5 V–15 V | 5 V–15 V |
| Program (option 2) | 0 V | 0 V | 5 V–15 V | 5 V–15 V | 0 V ramp up to 5 V–15 V |
| Erase (option 1) | 3 V–15 V | 0 V | 3 V–15 V | 3 V–15 V | −3 V to −15 V |
| Erase (option 2) | 15 V–22 V | 0 V | 15 V–22 V | 15 V–22 V | 0 V |
| Read | less than Vcc | 0 V | Vcc | Vcc | 0 V to Vcc |

*0 to (source voltage - 1 V)

In a manner similar to that described above with respect to cell 10, cell 60 may be used in multi-level threshold voltage applications. Acceptable ranges for bias conditions during programming, reading, and erasing cell 60 for multi-level applications are listed below in Table 6.

TABLE 6

| | Electrical bias conditions | | | | |
|---|---|---|---|---|---|
| Mode | Bit Line | Select Gate | Source | N-well | Control Gate |
| Program (option 1) | 0 V | 0 V | 5–15 V | 5–15 V | desired $V_p$, i.e, (5–15 V) |
| Program (option 2) | 0 V | 0 V | 5–15 V | 5–15 V | ramp up to desired $V_p$ |

TABLE 6-continued

| | Electrical bias conditions | | | | |
|---|---|---|---|---|---|
| Mode | Bit Line | Select Gate | Source | N-well | Control Gate |
| Erase (option 1) | 3–15 V | 0 V | 3–15 V | 3–15 V | −3 to −15 V |
| Erase (option 2) | 15–22 V | 0 V | 15–22 V | 15–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

The above-described embodiments in which single-poly transistor 16 is used as the storage cell suffer from a common drawback. Referring to FIG. 2, the P/N junction formed by control gate 36 and N-well 12 must remain reverse biased in order to prevent a large and undesirable current flow from control gate 36 to N-well 12. Accordingly, the voltage applied to control gate 36 should never exceed the voltage of N-well 12 by more than approximately 0.6 volts. As a result, the voltage coupled to floating gate 26 via control gate 36 is limited by the amount of voltage applied to N-well 12, thereby unnecessarily restricting the performance of transistor 16.

Figure 12:
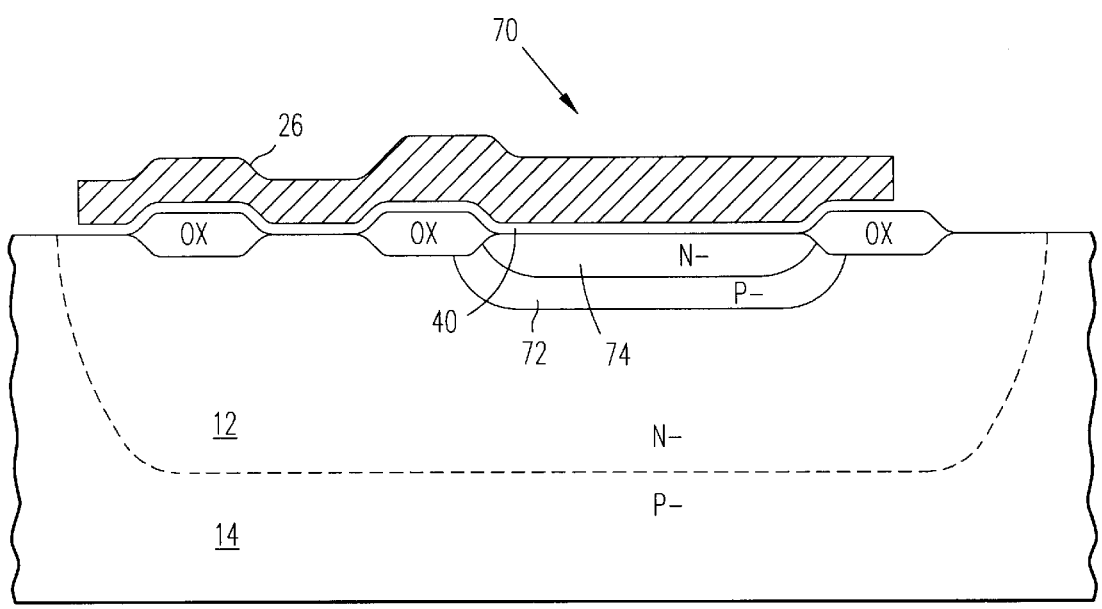
FIG. 12 is a cross-sectional view of a memory cell in accordance with yet another embodiment of the present invention.

In accordance with another embodiment of the present invention, a single-poly storage transistor 70 is provided, the performance of which is not so restricted. Referring now to FIG. 12, note that transistor 70 is identical to transistor 16 in every respect except for the structure of buried control gate 74, the operation and advantages of which will be described below. Accordingly, all components common to transistor 70 and transistor 16 (FIGS. 1–4) are appropriately labeled with same numerals.

Transistor 70 has a P− type diffusion region 72 within N-well 12. An N type diffusion region 74 is formed within P− diffusion region 72. N diffusion region 74 serves as the control gate for transistor 70, while P− diffusion region 72 insulates control gate 74 from N-well 12. Note that N-type control gate 74 may be electrically coupled to a contact in the same manner as is control gate 36 of cell 10 (described above with respect to FIGS. 1–4). Since control gate 74 is N type and is formed within P– diffusion region 72, the voltage on control gate 74 may exceed the voltage of N-well 12 without causing an undesirable current flow from control gate 74 to N-well 12. The elimination of such a restriction of the voltage of control gate 74 allows transistor 70 to go even further into depletion when programmed, thereby resulting in a higher read current and thus a faster memory cell.

Storage transistor 70 may replace transistor 16 in any of the above described memory cells 10, 50, and 60 to allow for faster access times. Tables 7, 8, and 9 list acceptable bias conditions for the programming, erasing, and reading of cells 10, 50, and 60, respectively, when employing transistor 70 as the storage element (as opposed to employing transistor 16).

TABLE 7

Electrical bias conditions

| Mode | Bit Line | Select Gate | Source | N-well | Control Gate |
|---|---|---|---|---|---|
| Program (option 1) | 0 V | 0 V | 5–15 V | 5–15 V | 5–17 V |
| Program (option 2) | 0 V | 0 V | 5–15 V | 5–15 V | ramp up to between 5–17 V from 0 V |
| Erase (option 1) | 3–15 V | 0 V | 3–15 V | 3–15 V | –3 to –15 V |
| Erase (option 2) | 15–22 V | 0 V | 15–22 V | 15–22 V | 0 V |
| Read | less than Vcc | 0 V | Vcc | Vcc | 0 to Vcc |

TABLE 8

| | Bit line | Drain select gate | Source select gate | Source | N-well | Cell control gate |
|---|---|---|---|---|---|---|
| Program | 0 V | 0 V | * | 5 V–15 V | 5 V–15 V | 5–17 V |
| Erase (option 1) | 3 V–15 V | 0 V | 3 V–15 V | 3 V–15 V | 3 V–15 V | –3 V to –15 V |
| Erase (option 2) | 15 V–22 V | 0 V | 15 V–22 V | 15 V–22 V | 15 V–22 V | 0 V |
| Read | less than Vcc | 0 V | 0 V | Vcc | Vcc | 0 V to Vcc |

*0 to (source voltage - 1 V)

TABLE 9

| | Bit line | Source Select gate | Source | N-well | Cell control gate |
|---|---|---|---|---|---|
| Program (option 1) | 0 V | 0 V | 5 V–15 V | 5 V–15 V | 5 V–17 V |
| Program (option 2) | 0 V | 0 V | 5 V–15 V | 5 V–15 V | ramp from 0 V up to between 5 V–17 V |
| Erase (option 1) | 3 V–15 V | 0 V | 3 V–15 V | 3 V–15 V | –3 to –15 V |
| Erase (option 2) | 15 V–22 V | 0 V | 15 V–22 V | 15 V–22 V | 0 V |
| Read | less than Vcc | 0 V | Vcc | Vcc | 0 V to Vcc |

*0 to (source voltage - 1 V)

Further, those embodiments of cells 10, 50, and 60 which employ as storage elements transistor 70 are also capable of multi-level threshold voltage applications, the operation of which is identical to that described above. Acceptable bias condition ranges for the programming, erasing, and reading of cells 10, 50, and 60 which employ transistor 70 are provided below in Tables 10, 11, and 12, respectively.

TABLE 10

Electrical bias conditions

| Mode | Bit Line | Select Gate | Source | N-well | Control Gate |
|---|---|---|---|---|---|
| Program (option 1) | 0 V | 0 V | 5–15 V | 5–15 V | ramp up to desired $V_p$ |
| Program (option 2) | 0 V | 0 V | 5–15 V | 5–15 V | desired $V_p$ |
| Ersse (option 1) | 3–15 V | 0 V | 3–15 V | 3–15 V | –3 to –15 V |
| Erase (option 2) | 15–22 V | 0 V | 15–22 V | 15–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

TABLE 11

| | Bit line | Drain select gate | Source select gate | Source | N-well | Cell control gate |
|---|---|---|---|---|---|---|
| Program (option 1) | $V_p$ | 0 V | 3–15 V | 3–15 V | 3–15 V | –3 to –15 V |
| Program (option 2) | $V_p$ | 0 V | 15–22 V | 15–22 V | 15–22 V | 0 V |
| Erase | 0 V | 0 V | * | 5–15 V | 5–15 V | 5–17 V |
| Read (option 1) | less than Vcc | 0 V | 0 V | Vcc | Vcc | 0 to Vcc |
| Read (option 2) | pre-charge to Vcc | 0 V | 0 V | 0 V | Vcc | 0 V |

*0 to (source voltage – 1 V)

TABLE 12

Electrical bias conditions

| Mode | Bit Line | Select Gate | Source | N-well | Control Gate |
|---|---|---|---|---|---|
| Program (option 1) | 0 V | 0 V | 5 V–15 V | 5 V–15 V | desired $V_p$, i.e, (5–17 V) |
| Program (option 2) | 0 V | 0 V | 5 V–15 V | 5 V–15 V | ramp up to desired $V_p$ |
| Erase (option 1) | 3 V–15 V | 0 V | 3 V–15 V | 3 V–15 V | –3 V to –15 V |
| Erase (option 2) | 15 V–22 V | 0 V | 15 V–22 V | 15 V–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

The advantageous operational characteristics of the above described embodiments allow for such embodiments to be fabricated by a process simpler than those conventional processes used to fabricate N-channel single-poly EEPROM cells. The fabrication of cell 10 will be described below in the context of a larger CMOS structure 100 which includes PMOS and NMOS peripheral transistors (these peripheral transistors may be used for instance as address decoders, current sensors, select transistors, and on). Although described below in the context of fabricating cell 10 in a twin well structure, it is to be noted the process described below may be easily modified so that cell 10 may be formed in an N-well structure. Further, the process described below may also be used to fabricate cells 50, 60, or 70 in either an N-well or a twin well structure.

Figure 13:
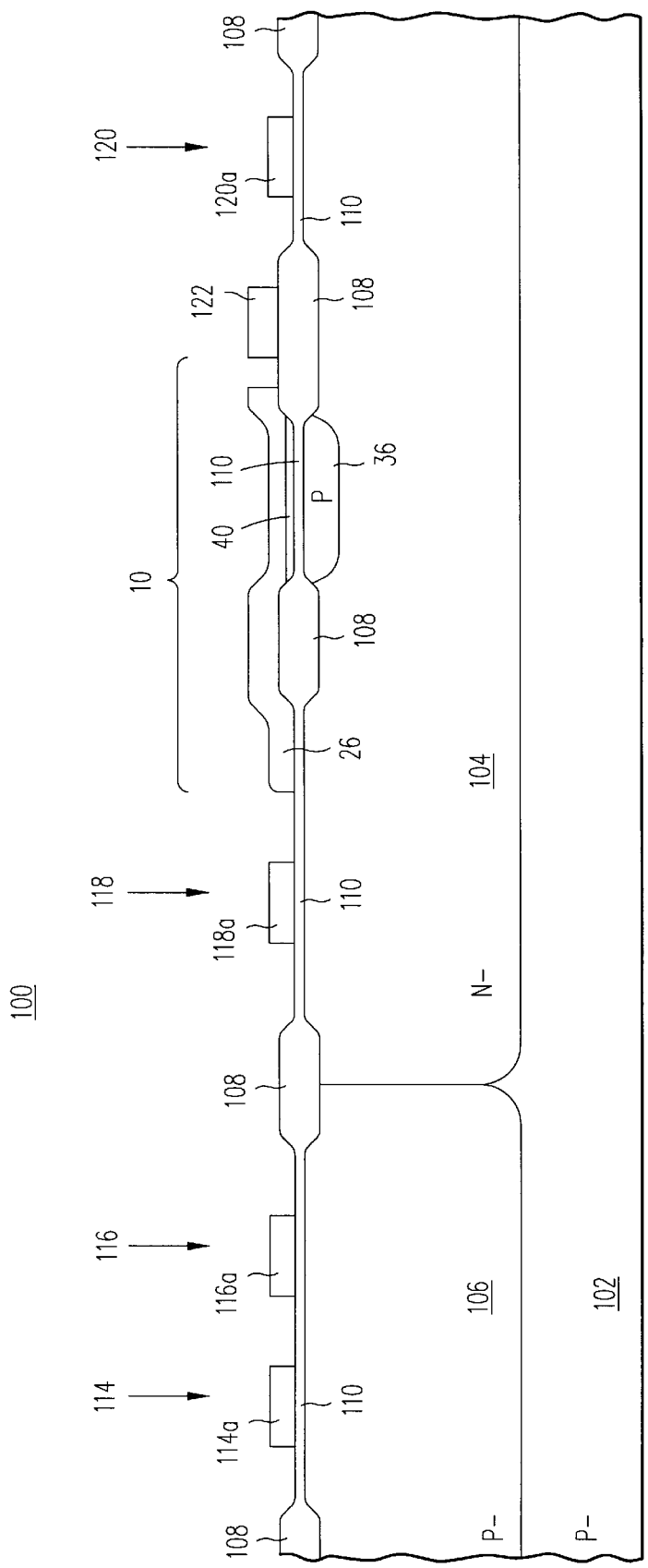
FIGS. 13 and 14 illustrate the fabrication of a P-channel single-poly memory cell in accordance with the present invention.

Referring now to FIG. 13, structure 100 includes a P-type substrate 102 having formed by conventional means therein an N-well 104 and a P-well 106. The resistivity and thickness of N-well 104 and P-well 106 will depend upon the desired characteristics of the devices to be formed therein. A LOCOS process is used to form isolation regions which will electrically insulate later-formed transistors from one another. Field oxide regions 108 approximately 7500 Å thick and a layer of sacrificial oxide (not shown) approximately 240 Å thick are formed on a top surface of substrate 102 by any suitable means.

Structure 100 is masked by any suitable means (not shown) such as for instance photoresist. P-type dopants such as $BF_2$ are implanted at an energy of 50 keV and a dosage of 1E14 ions/cm² into N-well 104 to form a P diffusion region 36 which will serve as the control gate for cell 10 (see also FIG. 2). The mask is then removed.

A layer of poly-silicon is deposited over a top surface of field oxide regions 108 and gate oxide 110 and selectively etched to form the pattern shown in FIG. 13. Portions 114a and 116a will serve as gates for NMOS peripheral transistors 114 and 116, respectively, while portions 118a and 120a will serve as gates for PMOS peripheral transistors 118 and 120, respectively. Portion 122 may serve as an interconnection between devices formed within structure 100. Portion 26 will serve as the floating gate of cell 10.

The process steps used for threshold voltage implants and channel stop implants for cell 10 and peripheral transistors 114, 116, 118, and 120, as well as for the formation of tunnel oxide 34 and oxide layer 40 separating floating gate 26 from control gate 36 of cell 10, are not shown in the Figures or discussed herein for simplicity. In the preferred embodiment, Arsenic is implanted at an energy of 100 keV and a dosage of approximately 2E13 ions/cm² or Phosphorus at an energy of 50 keV and a dosage of 2E13 ions/cm² as the threshold voltage implant for cell 10. Further, gate oxide layer 110 may also be implemented according to well known techniques and are thus described herein. Note, however, that as discussed above with respect to FIG. 3A, it is not necessary to open a tunnel window in tunnel oxide layer 34, thereby saving at least one masking step over conventional processes used to form N-channel single-poly EEPROM cells. Note that these just described process steps should be performed before the formation of gates 114, 116, 118, and 120, floating gate 26 and contact 122.

Figure 14:
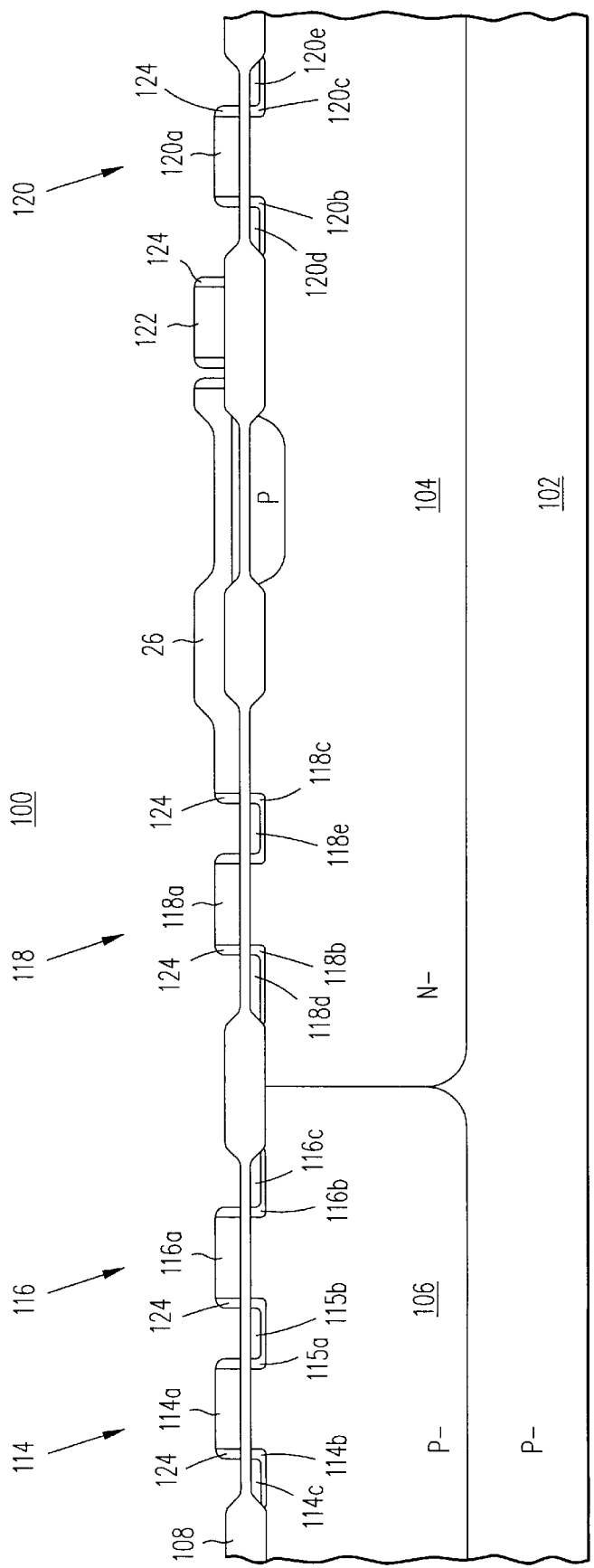
Figure 15:
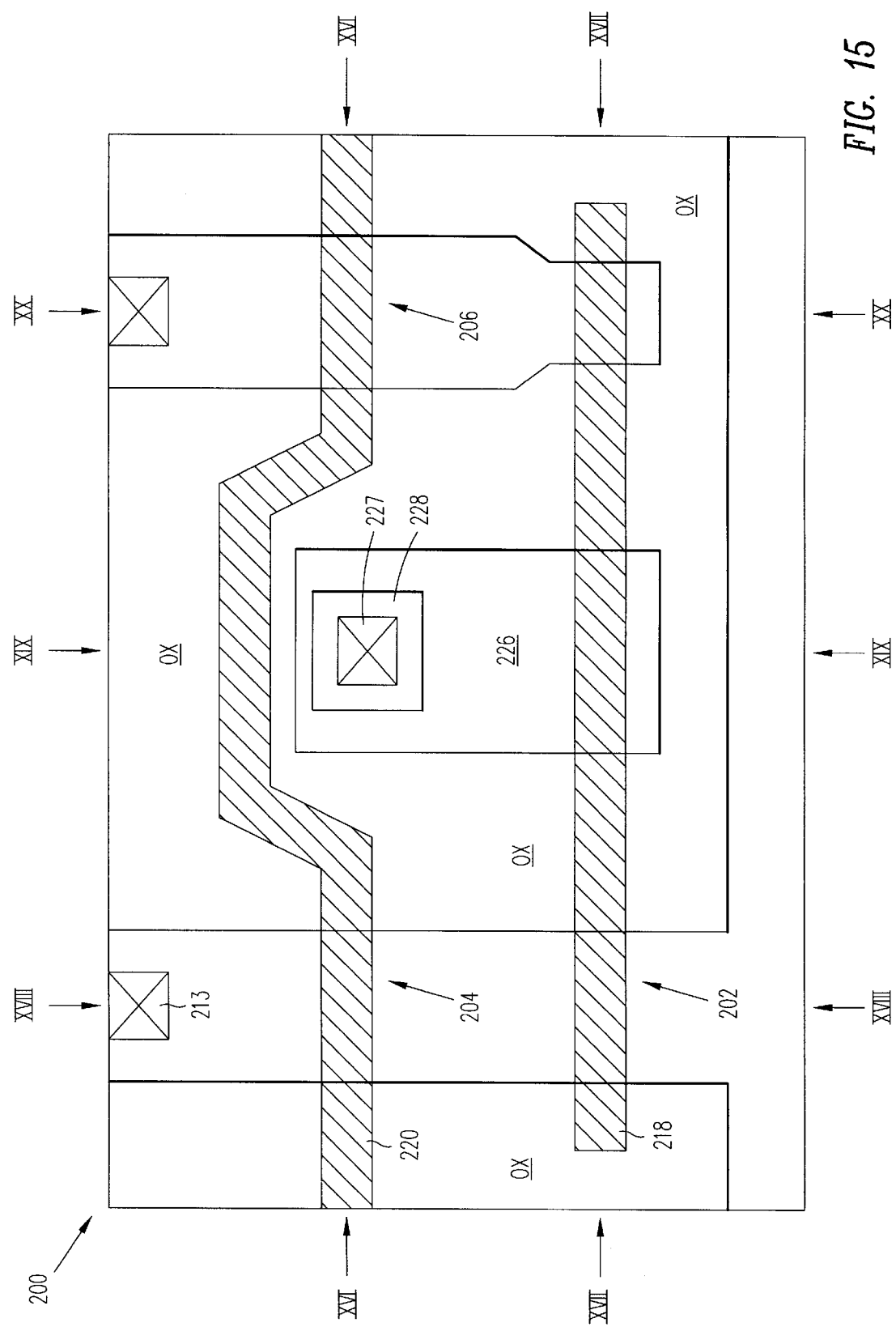
FIG. 15 is a top view of a PMOS single-poly memory device having an erase gate in accordance with the present invention.
Figure 16:
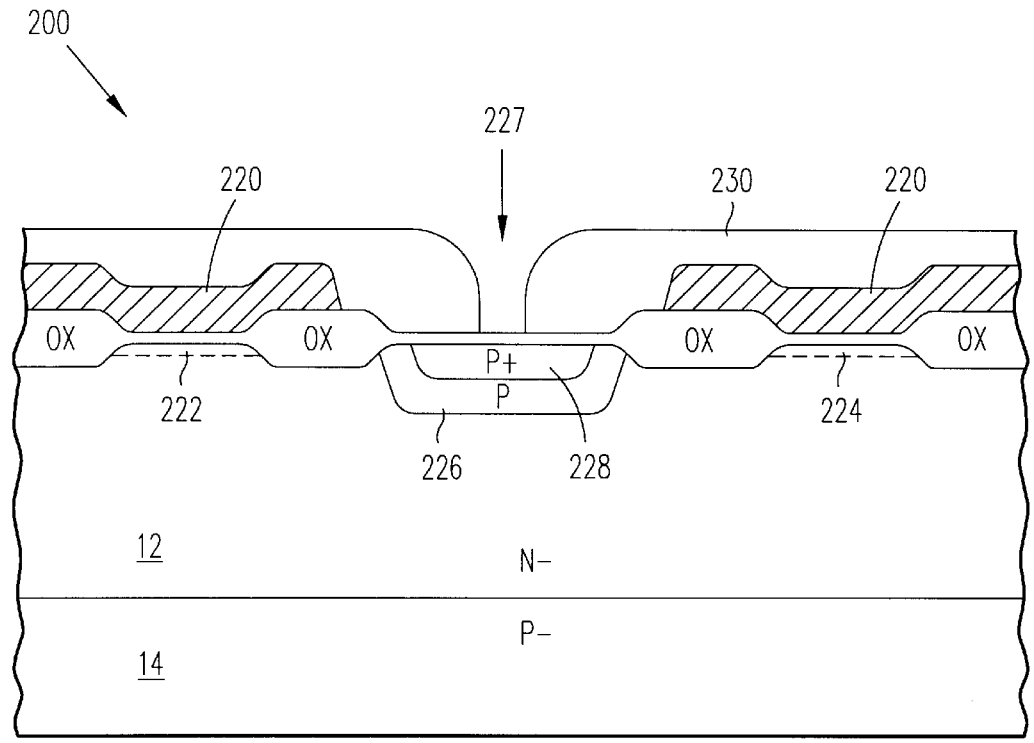
FIG. 16 is a cross-sectional view of the device of FIG. 15 taken along line AA—AA.
Figure 17:
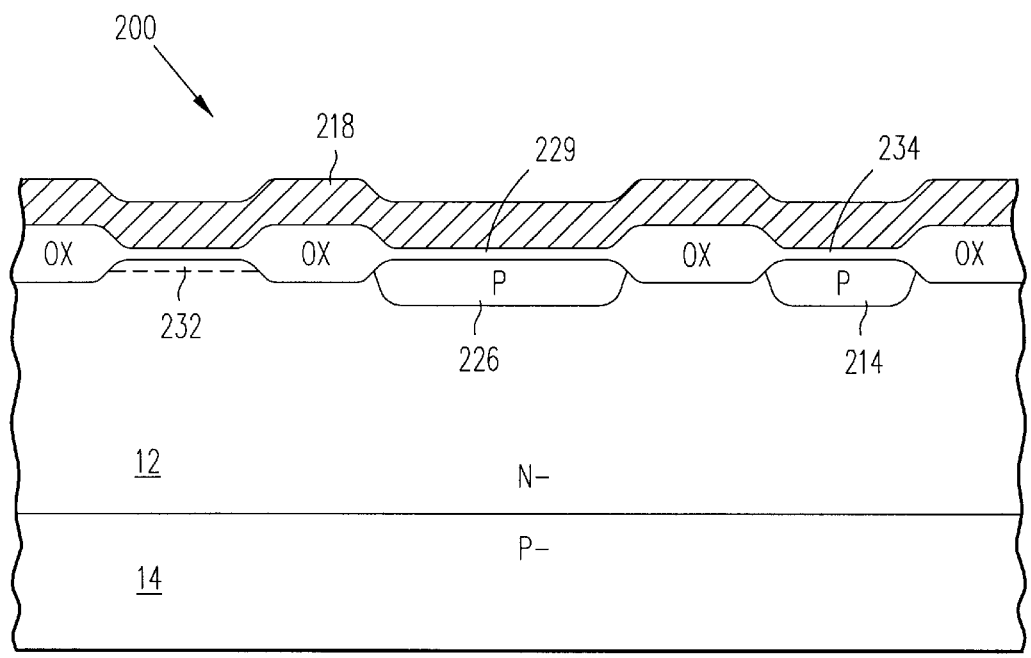
FIG. 17 is a cross-sectional view of the device of FIG. 15 taken along line BB—BB.

Referring now to FIG. 14, PMOS cell 10 and PMOS transistors 118 and 120 are masked (not shown). N-type dopants such as Phosphorus are implanted at an energy of approximately 40 keV and a dosage of approximately 3E13 ions/cm² into P-well 106 to form N-regions 114b, 115a, and 116b. The mask is then removed.

NMOS transistors 114 and 116 are then masked (not shown) and P-type dopants such as $BF_2$ are implanted at an energy of approximately 60 keV and a dosage of approximately 7E12 ions/cm² into N-well 104 to form N-regions 118b, 118c, 120b, and 120c. Sidewall oxide spacers 124 are then formed by conventional means on the sides of control gates 114, 116, 118, and 120, layer 122, and floating gate 26.

PMOS cell 10 and PMOS peripheral transistors 118 and 120 are again masked and N-type dopants, preferably Arsenic, are implanted at an energy of 80 keV and a dosage of 6E15 ions/cm² into P-well 106 to form N+ diffusion regions 114c, 115b, and 116c, as shown in FIG. 14. N–/N+ diffusion region 114b/114c serves as the source for NMOS transistor 114, N–/N+ diffusion region 115a/115b serves as the drain for NMOS transistor 114 and the source for NMOS transistor 116, and N–/N+ diffusion region 116b/116c serves as the drain for NMOS transistor 116. The PMOS mask is then removed.

Structure 100 is again masked and the sidewall spacers 124 (not shown) on the source and drain sides of floating gate 26 are dipped and removed. This ensures that in a subsequent doping step the source and drain regions (see FIG. 3A) of cell 10 will be of a P+ diffusion structure, as opposed to the lightly doped drain (LDD) structure of P−/P+ diffusion region 118c/118e. After this mask is removed, NMOS peripheral transistors 114 and 116 are masked and P-type implants, preferably $BF_2$, are implanted at an energy of 50 keV and a dosage of 2E15 ions/cm² into N-well 104 to form P+ regions 118d, 118e, 120d, and 120e, as well as P+ source 20 and P+ drain 22 regions (see FIG. 3) of cell 10. The P−/P+ diffusion regions 118b/118d and 118c/118e serve as the source and drain regions, respectively, of PMOS transistor 118, while P−/P+ diffusion regions 120b/120d and 120c/120e serve as the source and drain regions, respectively, of PMOS transistor 120.

The remaining portions of structure 100 may be completed according to well known fabrication techniques.

The process described above with respect to FIGS. 13 and 14 requires fewer masking steps than do conventional processes used in the fabrication of N-channel single poly memory cells. Since the source and drain regions of cell 10 may be formed simultaneously with the source and drain regions of PMOS peripheral transistors 118 and 120, an additional masking step is saved. Further, since as described earlier the operation of cell 10 does not require high voltages across its drain/N-well junction, neither N-channel or P-channel high voltage implants are necessary, thereby resulting in a further elimination of masking steps. In this manner, the fabrication of cell 10 may be realized while reducing manufacturing costs.

It is to be noted that the above described fabrication process may be easily adapted to construct memory cells employing as memory elements single-poly transistors 70 in accordance with embodiments of the present invention. Further, the bipolar and MOS transistors may be reversed while still realizing the benefits of the above described invention.

In accordance with yet another embodiment of the present invention, the structure of cell 10 is modified and an additional diffusion region added thereto so as to allow for lower erase voltages. Those components common to cell 200 and cell 10 are appropriately labeled with the same numerals.

Figure 18:
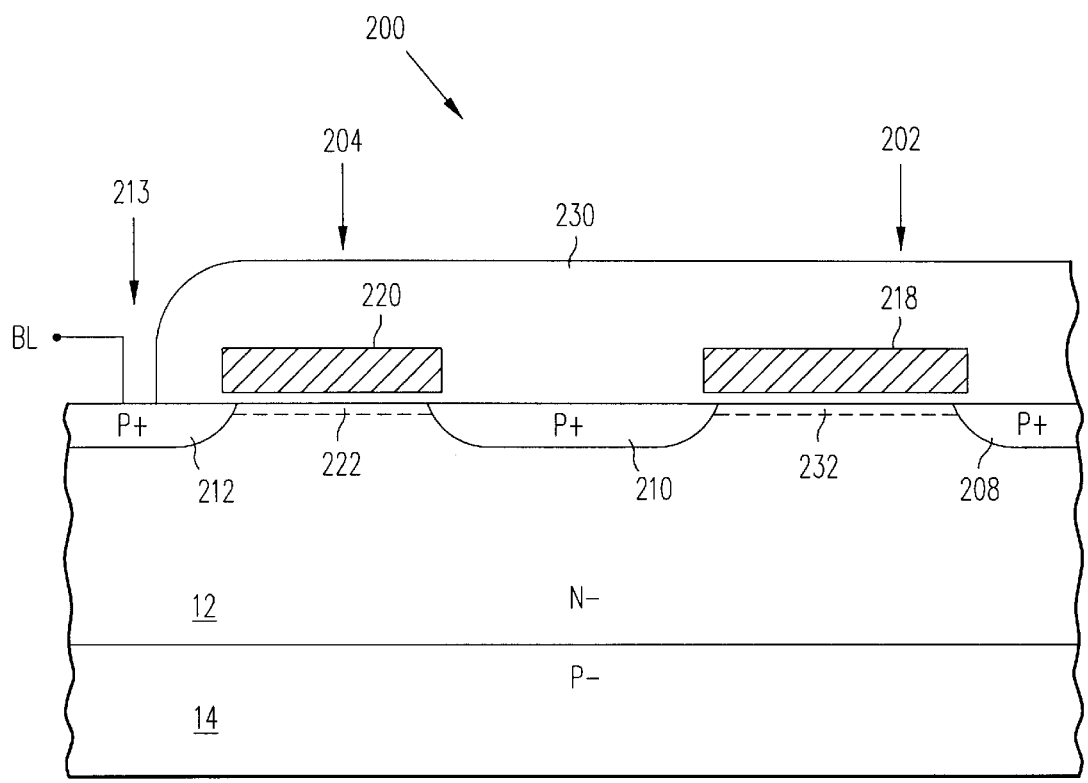
FIG. 18 is a cross-sectional view of the device of FIG. 15 taken along line CC—CC.
Figure 19:
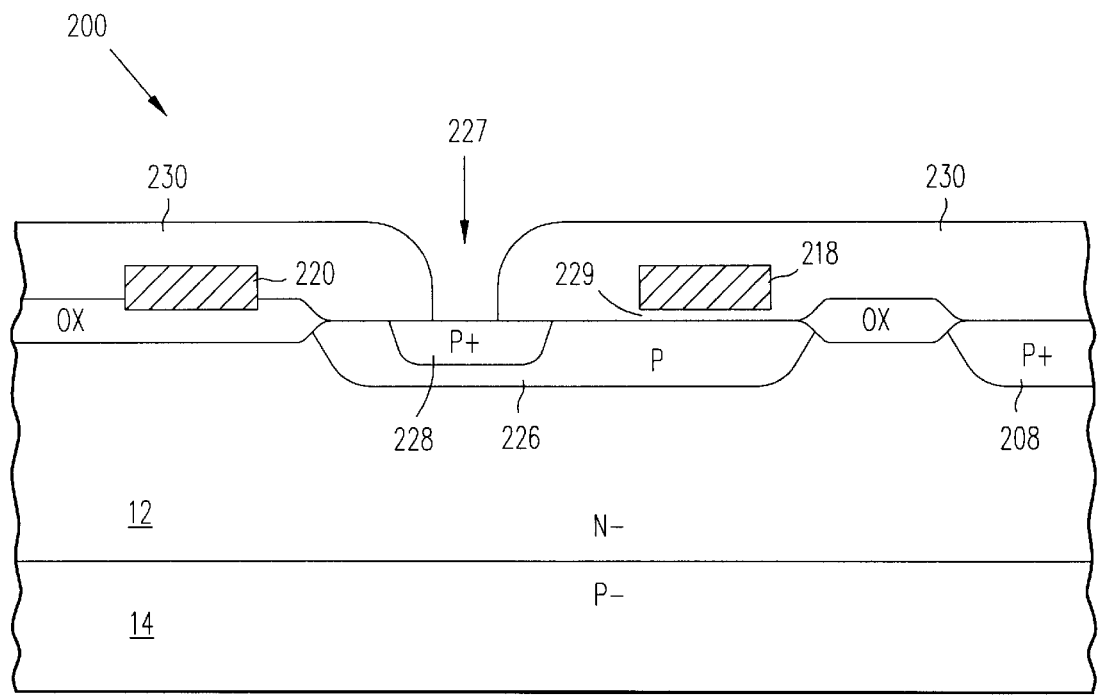
FIG. 19 is a cross-sectional view of the device of FIG. 15 taken along line DD—DD.
Figure 20:
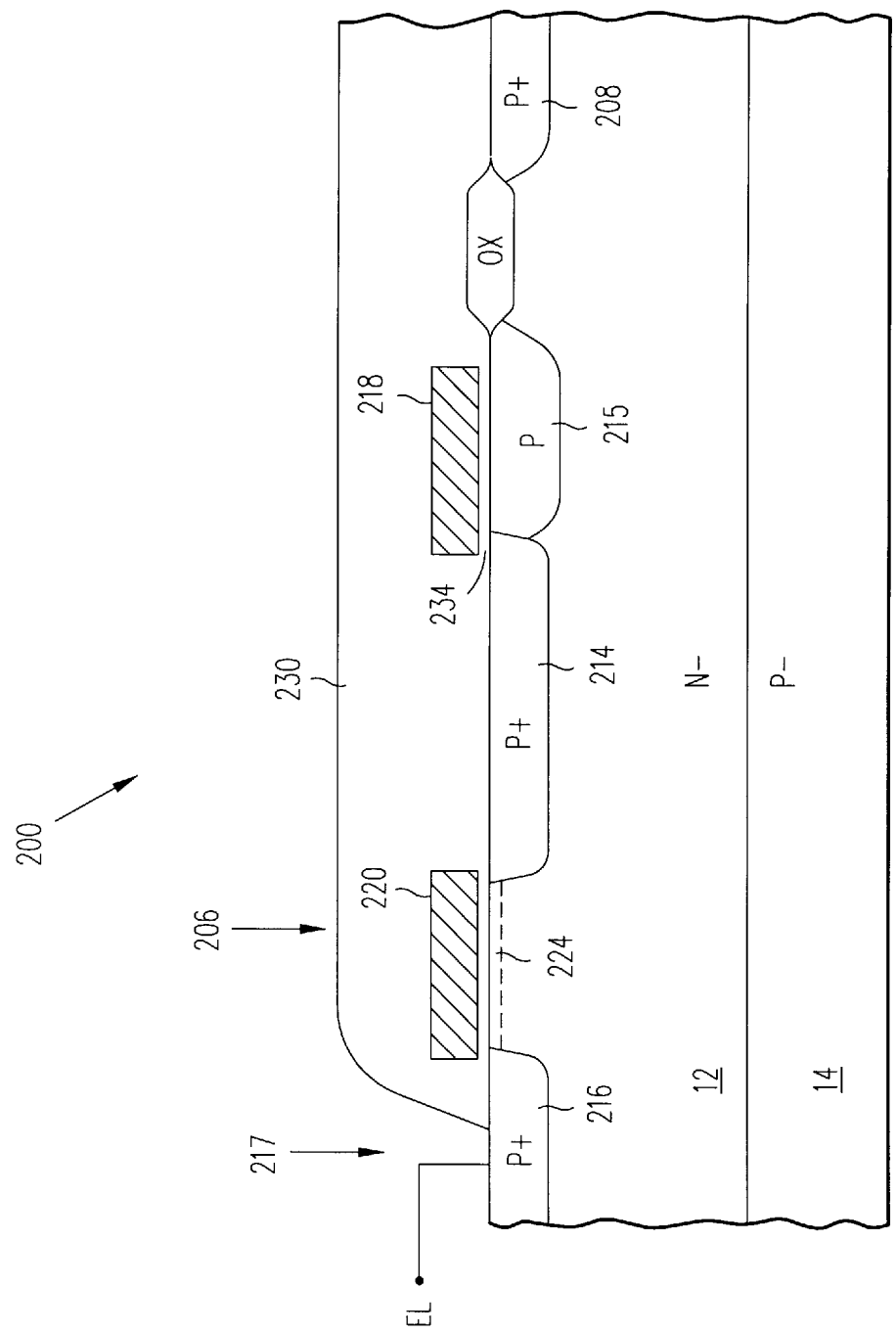
FIG. 20 is a cross-sectional view of the device of FIG. 15 taken along line EE—EE.

Referring collectively to FIGS. 15–20, cell 200 includes a storage transistor 202, a select transistor 204, and an erase transistor 206 separated by conventional field oxide regions OX. In FIG. 18, P+ diffusion region 208 serves as the source for storage transistor 202, P+ diffusion region 210 serves as both the drain for storage transistor 202 and the source for select transistor 204, and P+ diffusion region 212 serves as the drain of select transistor 204. A bit line BL is coupled to drain 212 of select transistor 204 via a contact 213. P+ diffusion regions 214 and 216 serve as the source and drain, respectively, of erase transistor 206 (FIG. 20). A contact 217 couples drain 216 of erase transistor 206 to an erase line EL. A poly-silicon layer 218 serves as the floating gate of storage transistor 202, and a polysilicon layer 220 serves as the gate for both select transistor 204 and erase transistor 206. Application of a bias voltage to gate 220 enhances a channel 222 (FIG. 18) extending between source 210 and drain 212 of select transistor 204 and enhances a channel 224 (FIG. 20) extending between source 214 and drain 216 of erase transistor 206.

A P-type buried diffusion layer 226 serves as the control gate of storage transistor 202 and has formed therein a P+ contact region 228. A layer of oxide 229 (FIG. 17) approximately between 80–350 Å thick is provided between control gate 226 and floating gate 218. An opening in insulating layer 230 and oxide 229 enables electrical contact with buried control gate 226 via a P+ contact region 228 (FIG. 19). A tunnel oxide layer 234 (FIG. 20) preferably between 80–130 Å thick is provided between floating gate 218 and a P diffusion region 215 and also between floating gate 218 and a portion of P+ diffusion region 214 to facilitate electron tunneling from floating gate 218 to P diffusion region 215 and to a portion of P+ diffusion region 214. Floating gate 218 and control gate 226 form an MOS capacitor in the same manner as that of conventional N-channel EEPROM cells. Note, however, that unlike conventional N-channel single-poly EEPROM cells, it is not necessary to open a tunnel window in tunnel oxide layer 234 of cell 200.

Cell 200 has in its unprogrammed state a threshold voltage $V_t$ equal to approximately −4.5 volts. To program cell 200 in FIG. 18, bit line BL and select gate 220 are grounded while source 208 of storage transistor 202, N-well 12, and erase line EL (which is coupled to drain 216 of erase transistor 206) are held at approximately 7 volts. A program voltage which ramps from 0 to approximately 12 volts is coupled to control gate 226 via P+ contact region 228 (FIG. 19). A fraction of the resultant voltage on control gate 226 is capacitively coupled to floating gate 218. In the preferred embodiment, ramping the voltage of control gate 226 from 0 to 12 volts results in approximately 7.5 volts being coupled to floating gate 218. Note that the precise amount of voltage so coupled to floating gate 218 depends upon the coupling ratio between control gate 226 and floating gate 218.

The application of the above-described voltages causes positively charged holes to accelerate across channel 232 from source 208 to drain 210 (FIG. 18). These holes collide with electrons in the depletion region proximate drain 210 and thereby generate high energy electrons which, being attracted to the positive charges present on floating gate 218, are injected from the depletion region into floating gate 218. The resultant negative charge on floating gate 218 depletes channel region 232 and forces cell 200 into deep depletion. When programmed as such, cell 200 has a $V_t$ equal to approximately 1 V. In some embodiments, a current limiting device (not shown) is coupled to bit line BL to prevent programming currents from exceeding approximately 100 μ, thereby limiting power consumption during programming.

Cell 200 is erased by grounding select gate 220, bit line BL, and source 208 of storage transistor 202, while applying approximately 8 V to erase line EL (FIG. 20) and N-well 12 and applying approximately −8 V to control gate 226 (FIG. 19). This electrical bias condition causes electrons to tunnel from floating gate 218 (FIG. 20) through tunnel oxide layer 234 into P diffusion region 215 and a portion of P+ diffusion region 214, thereby returning the threshold voltage of storage transistor 202 to its normal erased state value of approximately −4 V. Note that during erasing operations electrons do not tunnel from floating gate 218 into channel 232, source 208, or drain 210 of storage transistor 202.

Erasing floating gate 218 in the manner described above allows for lower erase voltages and also allows for cell 200 to handle higher read currents, and thereby operate at higher speeds, without undesirably increasing the size dimensions of cell 200, as will be described below. It is known that the amount of read current realizable by a memory cell is directly proportional to the width of its channel, whereby achieving higher read speeds requires an increase in the channel width. However, when discharging the floating gate of such a memory cell, only a fraction of the erase voltage applied to the control gate is coupled to the floating gate.

Thus, in order to minimize the erase voltage, it is desirable to maintain the coupling ratio between the control gate and the floating gate as high as possible. It therefore follows that an increase in the access time of such a memory cell comes at the expense of either a wider control gate or higher erase voltage and, as such, involves an undesirable trade-off of size versus erase voltages.

The above-described erasing operation of cell 200 eases this trade-off. Since electrons tunnel from floating gate 218 to P diffusion region 215 and to a portion of P+ diffusion region 214, as opposed to the active regions of storage transistor 202, it is the coupling between control gate 226 and P diffusion region 215/P+ diffusion region 214 which determines the extent to which an erase voltage is coupled to floating gate 218. Thus, in accordance with the present invention, the width of channel 232 may be increased in order to accommodate higher read currents while maintaining the width of control gate 226 without undesirably requiring higher erase voltages. Thus, by providing a narrow width P diffusion region 215, a higher coupling ratio may be achieved, thereby allowing for even lower erase voltages.

Where it is desired to read cell 200, source 208 and N-well 12 are held at $V_{cc}$ while select gate 220 is grounded. Control gate 226 is held at approximately $V_{cc}$–2V and a read voltage of approximately $V_{cc}$–2V is provided to bit line BL. Cell 200 will conduct channel current only if cell 200 is programmed, i.e., only if there is negative charge stored in floating gate 218. Thus, since a read current flows through cell 200 when floating gate 218 is negatively charged, a programmed cell 200 does not suffer from read disturb problems characteristic of conventional N-channel EEPROM cells. When cell 200 is in an erased state, the voltage on floating gate 218 is always less than the voltage on drain 210. In this manner, cell 200 does not exhibit read disturb problems when in an erased state.

Acceptable ranges for the above-described reading, erasing, and programming bias conditions for cell 200 are provided below in Table 12.

TABLE 12

| | Electrical bias conditions | | | | |
|---|---|---|---|---|---|
| Mode | Bit Line | Select Gate | Source | N-well | Control Gate | Erase Line |
| Program | 0 V | 0 V | 5–8 V | 5–8 V | ramped from 0 V to 12 V | 5–8 V |
| Erase | 0 V | 0 V | 0 V | 3–13 V | –3 to –13 V | 3–13 V |
| Read | less than Vcc | 0 V | Vcc | Vcc | 0 to Vcc | float or 0 V |

It is to be noted that the advantages described above with respect to cell 10 realized by employing a P-channel memory cell structure which is programmed by hot electron injection and erased by electron tunneling are equally applicable to the embodiments illustrated in FIGS. 15–20.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A P-channel memory cell comprising:

a P+ source and a P+ drain formed in an N-well;

a channel extending between said source and said drain;

a floating gate overlying said channel;

a first P-type diffusion region formed in said N-well and underlying a first portion of said floating gate, said first P-type diffusion region serving as a control gate of said cell;

a second P-type diffusion region formed in said N-well and underlying a second portion of said floating gate, said second P-type diffusion region serving as an erase gate of said cell; and a third P-type diffusion region formed in said N-well and underlying a third portion of said floating gate, said third P-type diffusion region serving as an additional erase gate of said cell.

2. The cell of claim 1, wherein said control gate and said erase gate are separated by an oxide region.

3. The cell of claim 1, wherein said cell is programmed by the injection of hot electrons from a portion of said channel proximate said drain to said floating gate.

4. The cell of claim 1, wherein said cell is erased by the tunneling of electrons from said floating gate into said additional erase gate and portions of said erase gate.

5. The cell of claim 1, wherein said erase gate and said additional erase gate are adjacent to one another.

6. The cell of claim 3, wherein said cell is programmed by applying between approximately 5 and 8 volts to said source, to said N-well, and to said erase gate, applying approximately 0 volts to said drain, and ramping said control gate from approximately 0 volts to approximately 12 volts.

7. The cell of claim 4, wherein said cell is erased by applying approximately 0 volts to said source and said drain, applying between approximately 3 and 13 volts to said N-well and to said erase gate, and applying between approximately –3 and –13 volts to said control gate.

8. The cell of claim 1, wherein said cell is read by applying a supply voltage to said source and to said N-well, applying a voltage between 0 volts and said supply voltage to said control gate, either floating or applying approximately 0 volts to said erase gate, and applying a voltage less than said supply voltage to said drain.

9. The cell of claim 3, wherein said cell is programmed by applying approximately 7 volts to said source, to said N-well, and to said erase gate, applying approximately 0 volts to said drain, and ramping said control gate from approximately 0 volts to approximately 12 volts.

10. The cell of claim 4, wherein said cell is erased by applying approximately 0 volts to said source and said drain, applying approximately 8 volts to said N-well and to said erase gate, and applying approximately –8 volts to said control gate.

11. The cell of claim 1, wherein said cell is read by applying a supply voltage to said source and to said N-well and applying approximately 2 volts less than said supply voltage to said control gate and to said drain.

* * * * *